United States Patent
Salles et al.

(10) Patent No.: US 9,897,644 B2
(45) Date of Patent: Feb. 20, 2018

(54) METHOD AND SYSTEM FOR TESTING A SEMICONDUCTOR DEVICE AGAINST ELECTROSTATIC DISCHARGE

(71) Applicants: Alain Salles, Ramonville St Agne (FR); Patrice Besse, Tournefeuille (FR); Stephane Compaing, St Orens de Gameville (FR); Philippe DeBosque, Saint Jory (FR)

(72) Inventors: Alain Salles, Ramonville St Agne (FR); Patrice Besse, Tournefeuille (FR); Stephane Compaing, St Orens de Gameville (FR); Philippe DeBosque, Saint Jory (FR)

(73) Assignee: NXP USA, Inc., Austin, TX (US)

( * ) Notice: Subject to any disclaimer, the term of this patent is extended or adjusted under 35 U.S.C. 154(b) by 162 days.

(21) Appl. No.: 14/434,790

(22) PCT Filed: Oct. 10, 2012

(86) PCT No.: PCT/IB2012/002333
§ 371 (c)(1),
(2) Date: Apr. 10, 2015

(87) PCT Pub. No.: WO2014/057301
PCT Pub. Date: Apr. 17, 2014

(65) Prior Publication Data
US 2015/0276847 A1   Oct. 1, 2015

(51) Int. Cl.
*G01R 31/26* (2014.01)
*G01R 31/00* (2006.01)
*G01R 1/04* (2006.01)

(52) U.S. Cl.
CPC ........... *G01R 31/26* (2013.01); *G01R 1/0416* (2013.01); *G01R 31/001* (2013.01); *G01R 31/002* (2013.01)

(58) Field of Classification Search
CPC ............... G01R 31/26; G01R 31/2601; G01R 31/2621; G01R 31/2853; H01L 22/14
(Continued)

(56) References Cited

U.S. PATENT DOCUMENTS 5,132,612 A * 7/1992 Burns ................. G01R 31/2832
324/72.5
5,416,782 A * 5/1995 Wells ..................... G11C 29/44
714/719
(Continued)

FOREIGN PATENT DOCUMENTS

JP   2011191260 A   9/2011

OTHER PUBLICATIONS

Sangameswaran S, De Coster J, Groeseneken G, De Wolf I; Reliability test methodology for mems and moems under electrical overstress and electrostatic discharge stress. J. Micro/Nanolith. MEMS MOEMS. 0001 ;11 (2):021204-1-021204-8. doi:10.1117/1.JMM.11.2.021204.*

(Continued)

*Primary Examiner* — Jermele M Hollington
*Assistant Examiner* — Christopher McAndrew
(74) *Attorney, Agent, or Firm* — Charlene R. Jacobsen

(57) ABSTRACT

A method of testing a semiconductor device against electrostatic discharge includes operating the semiconductor device, and, while operating the semiconductor device, monitoring a functional performance of the semiconductor device. The monitoring includes monitoring one or more signal waveforms of respective one or more signals on respective one or more pins of the semiconductor device to obtain one or more monitor waveforms, and monitoring one or more register values of one or more registers of the semiconductor device to obtain one or more monitor register values as function of time. The method includes applying an (Continued)

electrostatic discharge event to the semiconductor device while monitoring the functional performance of the semiconductor device. The method can further comprise determining a functional change from the one or more monitor waveforms and the one or more monitor register values as function of time.

17 Claims, 8 Drawing Sheets

(58) Field of Classification Search
USPC .................................................. 324/762.07
See application file for complete search history.

(56) References Cited

U.S. PATENT DOCUMENTS

| | | | | |
|---|---|---|---|---|
| 5,523,699 | A * | 6/1996 | Miyagawa | G01R 31/002 324/762.02 |
| 6,037,636 | A * | 3/2000 | Crippen | H01L 27/0266 257/328 |
| 6,469,536 | B1 | 10/2002 | Kessler et al. | |
| 7,650,552 | B2 | 1/2010 | Pourbigharaz et al. | |
| 7,863,920 | B2 * | 1/2011 | Gaertner | G01R 31/002 324/762.02 |
| 9,443,041 | B2 * | 9/2016 | Shroff | G06F 11/261 |
| 2007/0018670 | A1 * | 1/2007 | Ito | G01R 31/002 324/750.3 |
| 2009/0066354 | A1 | 3/2009 | Gaertner et al. | |
| 2009/0289636 | A1 * | 11/2009 | Hernandez | G01R 31/002 324/555 |
| 2010/0315748 | A1 * | 12/2010 | Kwong | H03K 19/00315 361/56 |
| 2014/0269123 | A1 * | 9/2014 | Kim | G11C 11/40618 365/200 |

OTHER PUBLICATIONS

International Search Report and Written Opinion correlating to PCT/IB2012/002333 dated Jul. 26, 2013.
SO 11452-1, "Road Vehicles—Component Test Methods for Electrical Disturbances from Narrowband Radiated Electromagnetic Energy Part1: General Principles and Terminology," ISO, Standard ISO 11452-1, 2005.
ISO 10605, "Road Vehicles—Test Methods for Electrical Disturbances from Electrostatic Discharge," Standard ISO 10605, 2008.
IEC 61000-4-2, "Electromagnetic Compatibility (EMC)—Part 4-2: Testing and Measurement Techniques—Electrostatic Discharge Immunity Test," Standard IEC 61000-4-2, 2008.

* cited by examiner

METHOD AND SYSTEM FOR TESTING A SEMICONDUCTOR DEVICE AGAINST ELECTROSTATIC DISCHARGE

FIELD OF THE INVENTION

This invention relates to a method and system for testing a semiconductor device against electrostatic discharge.

BACKGROUND OF THE INVENTION

Electrostatic discharge, electro-magnetic interference and other external electrical stresses may cause damage to a semiconductor device. The design of semiconductor devices involves extensive testing of their immunity against external stresses by testing whether the semiconductor device continues to perform during and/or after being subjected to such external stresses. Typically, this involves applying a series of tests, wherein each test involves applying an external stress according to well-defined test conditions to the semiconductor device and subsequently testing whether the semiconductor device still performs well. The well-defined test conditions may e.g. be defined according to one or more standards for specific applications. For example, standard document ISO 10605, "Road vehicles—Test methods for electrical disturbances from electrostatic discharge", Standard ISO 10605, 2008 provides a standard for ESD test conditions and classification for electrical components of road vehicles. As another example, Standard IEC 61000-4-2, 2008, "Electromagnetic compatibility (EMC)—Part 4-2: testing and measurement techniques—Electrostatic discharge immunity test" provides a standard for ESD test conditions of an ESD test that is performed as part of an EMC test and a classification. However, the standards mentioned above only define test conditions, such as ESD stress parameters, and classifications of the tested modules/devices, but these standards do not provide any information as to specific components of the tested module/devices (i.e., which of the semiconductor devices or other components used therein), nor on the type and/or cause of failure. For example, the standard mentioned above define a functional status classification to describe the operational status of a device or system during and after exposure to an electro-magnetic environment in five classes A-E with:

- Class A: all functions of a device or system perform as designed during and after exposure to a disturbance;
- Class B: all functions of a device or system perform as designed during exposure; however, one or more of them may go beyond the specified tolerance. All functions return automatically to within normal limits after exposure is removed. Memory functions shall remain class A;
- Class C: one or more functions of a device or system do not perform as designed during exposure but return automatically to normal operation after exposure is removed;
- Class D: one or more functions of a device or system do not perform as designed during exposure and do not return to normal operation until exposure is removed and the device or system is reset by a simple "operator/use" action; and
- Class E: one or more functions of a device or system do not perform as designed during and after exposure and cannot be returned to proper operation without repairing or replacing the device or system.

SUMMARY OF THE INVENTION

The present invention provides a method and system for testing a semiconductor device against electrostatic discharge as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
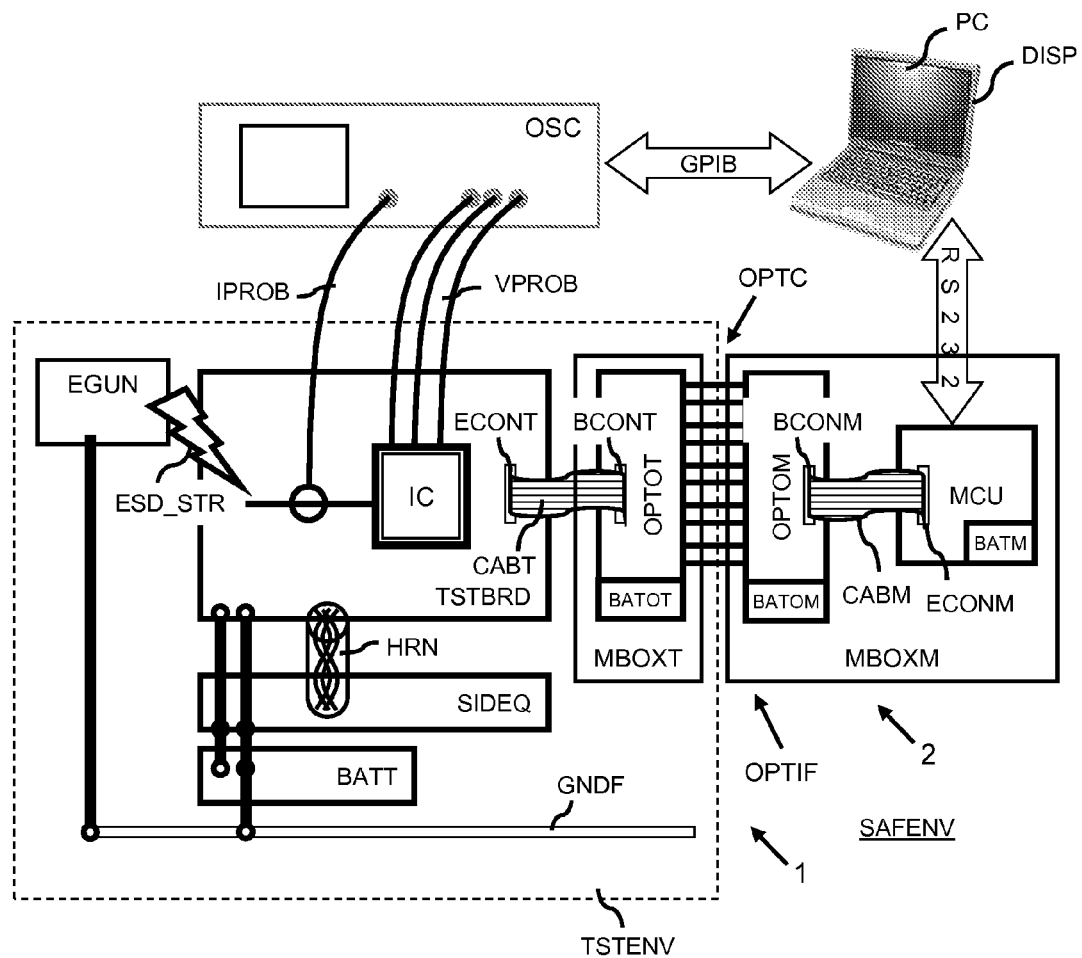
FIG. 1 schematically shows an example of an embodiment of a system for testing a semiconductor device against electrostatic discharge.

FIG. 1 schematically shows an example of an embodiment of a system 1 for testing a semiconductor device IC against electrostatic discharge.

The system 1 comprises a test board TSTBRD for carrying the semiconductor device IC during testing of the semiconductor device IC. The semiconductor device IC may be rigidly connected to the test board TSTBRD, which may e.g. provide an optimal electrical and/or thermal connection between the semiconductor device IC and the test board TSTBRD. The semiconductor device IC may alternatively be temporarily received in a socket on the test board TSTBRD, to, e.g., allow using the same test board TSTBRD to sequentially test a plurality of semiconductor devices.

The test board TSTBRD comprises a register interface for accessing one or more registers (indicated in FIG. 6 as REG1 and REG2) of the semiconductor device IC. The register interface may be provided by an internal register interface (indicated as REGIF in FIG. 6) in the semiconductor device connected via one or more register interface pins (indicated as PIN_RIF in FIG. 6) and one or more conductors on the test board TSTBRD to a test-board connector ECONT for connecting to a first flat-cable CABT. The test board TSTBRD comprises one or more test points for measuring signals on pins of the semiconductor device.

The test points may be probe points connected to the associated pins with conductors on the test board TSTBRD, whereby the test points may be provided at a small distance from the pins of the semiconductor device to allow an easy access with a probe to the test points. The test points may correspond to the pins of the semiconductor device.

The system 1 further comprises an opto-coupled interface OPTIF connected to the register interface, for example via the first flat-cable CABT. The opto-coupled interface OPTIF may hereby allow writing and/or reading of the one or more registers from an external device via the opto-coupled interface.

The system 1 comprises a control unit MCU for controlling the semiconductor device IC. The control unit MCU may comprise a microcontroller UC on a control board MCUBRD (as for example shown in FIG. 8). The control unit MCU may comprise a microcontroller that is under control of a host machine, e.g., via a serial interface such as an RS232 interface RS232. The control unit MCU is connected via the opto-coupled interface OPTIF to the test board TSTBRD. The control unit MCU is arranged to monitor one or more register values of one or more registers of the semiconductor device to obtain one or more monitor register values as function of time. Hereto, the control unit MCU may, for example, be arranged to read one or more register values via the opto-coupled interface OPTIF at predetermined time intervals to obtain one or more monitor register values as function of time. The control unit MCU may, in a further or alternative example, be arranged to read one or more register values in response to a read instruction received over the serial interface RS232.

The system one comprises a waveform measurement unit OSC connected to the test board TSTBRD. The waveform measurement unit OSC may e.g. be connected with probes VPROB to the test points of the test board TSTBRD. The waveform measurement unit OSC is arranged to monitor one or more signal waveforms of respective one or more signals on respective one or more pins of the semiconductor device to obtain one or more monitor waveforms. The waveform measurement unit OSC may e.g. comprise a high-bandwidth digital oscilloscope. The waveform measurement unit OSC may further be connected with a voltage probe IPROB to the test board TSTBRD to detect and measure an electrostatic discharge current on the test board TSTBRD.

The system comprises an ESD generator EGUN arranged to apply an electrostatic discharge event ESD_STR to the semiconductor device. The ESD generator EGUN may, for example, be arranged to apply a plurality of ESD pulses which together form an electrostatic discharge event ESD_STR as defined in one of the standards mentioned above. In the following, the electrostatic discharge event ESD_STR may also be referred to as an ESD event or as an ESD stress.

The system further comprises an inspection unit PC connected to the control unit MCU for receiving the one or more monitor register values, for example via a serial RS232 interface, via a USB interface, via a private area network, a local area network, via another wired interface, or via a wireless interface. The inspection unit PC is further connected to the waveform measurement unit OSC for receiving the one or more monitor waveforms, for example via a GPIB interface, via a private area network, a local area network or via any other suitable interface. Herein and in the following, the inspection unit is indicated with reference sign PC, to indicate that the inspection unit may be a personal computer, such as a desktop computer or a laptop computer. However, the inspection unit may be any type of suitable device that is capable of receiving the one or more monitor register values and the one or more monitor waveforms and allowing inspection. The inspection unit PC may be arranged to store the one or more monitor register values and the one or more monitor waveforms in a memory. The one or more monitor register values and the one or more monitor waveforms may be temporarily stored or permanently stored, depending on a user's wish to have the one or more monitor register values and the one or more monitor waveforms available for inspection for a short or longer period of time.

In the exemplary system shown in FIG. 1, the semiconductor device IC is arranged on the test board TSTBRD. The test board is connected to a test supply BATT and a reference line GNDF, typically associated with ground. Side equipment SIDEQ is connected to the test board TSTBRD via a wire harness HRN to provide dedicated functions and/or to provide test signals to be inputted to the semiconductor device IC during test. The side equipment SIDEQ may also be supplied from the test supply BATT. The side equipment SIDEQ and the ESD generator EGUN may also be connected to the reference line GNDF.

The ESD generator EGUN, test board TSTBRD with semiconductor device IC, side equipment SIDEQ, test supply BATT, reference lines GNDF and the part of the optical interface OPTIF between the optical connection OPTC and the test board TSTBRD may together be referred to as a test environment TSTENV.

The waveform measurement unit OSC, the inspection unit PC, the control unit MCU and the part of the optical interface OPTIF between the optical connection OPTC and the control unit MCU may together be referred to as a safe environment SAFEENV.

The optical interface OPTIF comprises a test-side interface board OPTOT, a safe-side interface board OPTOM and an optical connection OPTC. The optical connection OPTC connects the test-side interface board OPTOT to the safe-side interface board OPTOM via optical fibres, and hereby provides an electrically insulating interface between the test environment TSTENV and the safe environment SAFEENV, in particular between the semiconductor device IC and the control unit MCU. The optical connection OPTC may be short, but may in particular have a length of at least 50 cm, such as at least 1 m, such as in between 1 m and 100 m, such as in between 5 m and 20 m. Such relatively large length allows to operate the control unit MCU at a sufficiently large distance from the ESD generator and the ESD event in order not to be adversely effected by the ESD event during testing.

The test-side interface board OPTOT comprises a test-side electro-optical convertor EOCONVT (see also FIG. 7 below) and an interface-board cable socket (not shown) wherein an interface-board connector BCONT of the first flat-cable CABT is received. Another connector ECONT at the other end of the first flat-cable CABT is received in a test-board cable socket (not shown).

The test-side interface board OPTOT comprises a test-side convertor supply BATOT for supplying the components on the test-side interface board OPTOT, such as a transmitter and/or receiver of the test-side electro-optical convertor EOCONVT. The test-side convertor supply BATOT may be galvanically isolated from the test board TSTBRD and, in particular, from the semiconductor device IC. This may allow to keep the supply voltage as supplied from the test-side convertor supply BATOT to the test-side electro-optical convertor EOCONVT substantially immune to ESD events applied to the semiconductor device IC. The test-side electro-optical convertor EOCONVT, the interface-board connector BCONT and the test-side convertor supply BATOT may be arranged inside a test-side metallic box MBOXT that forms a Faraday cage around the test-side electro-optical convertor EOCONVT and the test-side convertor supply BATOT. This may shield the test side of optical interface against EMC pollution that may be associated with the ESD event.

The safe-side interface board OPTOM comprises a safe-side electro-optical convertor EOCONVM (see also FIG. 8 below) and a safe-side interface-board cable socket (not shown) wherein a safe-side interface-board connector BCONM of a second flat-cable CABM is received. Another connector ECONM at the other end of the second flat-cable CABM is received in a control-board cable socket (not shown) on the control board MCUBRD. Hereby, the safe-side electro-optical convertor EOCONVM is electrically connected to the control unit MCU. The safe-side electro-optical convertor EOCONVM, safe-side interface-board connector BCONM, the safe-side convertor supply BATOM and the control unit MCU (in particular, the microcontroller UC of the control unit MCU) may be arranged inside a safe-side metallic box MBOXM forming an associated Faraday cage around the safe-side electro-optical convertor EOCONVM, the safe-side convertor supply (BATOM) and the control unit MCU. This may shield the safe side of the optical interface and the control unit MCU against EMC pollution that may be associated with the ESD event.

The safe-side interface board OPTOM may comprise a safe-side convertor supply BATOM for supplying the components on the safe-side interface board OPTOM, such as a transmitter and/or receiver of the safe-side electro-optical convertor EOCONVM. The safe-side convertor supply BATOM may be arranged inside the safe-side metallic box MBOXM.

The control board MCUBRD may further be provided with a control supply BATM for supplying the components on the control board MCUBRD, such as the microcontroller UC, with a control supply voltage.

With the system 1, it is possible to not just detect whether a semiconductor device is immune to one or more external stresses, but also to analyse the effect of one or more ESD stresses on the functional performance of the semiconductor device. Analysis of the one or more monitor register values as function of time and the one or more monitor waveforms, e.g., by correlating changes observed in the one or more monitor register values as function of time with deviations of the one or more monitor waveforms compared to expected waveforms, may allow to determine which specific functional change occurs as a result of an external stress. It may further be possible to determine a root cause of the functional change from the functional change and/or the one or more monitor register values as function of time and/or the one or more monitor waveforms. When knowing its cause, the design of the semiconductor device and/or the design of any arrangements of external components connecting to the semiconductor device during its application, may be adapted to improve its robustness against external stresses that have been specifically identified to cause a specific functional change.

The term "functional change" may relate to any change in functional operation of any of the functional unit in the semiconductor device. A functional change may thus be, for example, a loss of one or more bits, a communication loss, a miss-communication, an output impedance change, a voltage regulator disturbance, an operation mode change (with operation modes being, e.g., normal mode, sleep mode, stop mode, reset mode).

The term "root cause" may relate to any physical, electrical, electronic or mechanical cause of the functional change and/or an absence of any precautionary measure in the design of the semiconductor device to prevent a functional change from happening. A root cause may thus be, for example, a current injection during ESD stress into the substrate of the semiconductor device producing a GND shift (e.g, where the functional change relates to a mode change due to voltage regulator disturbance), an absence of repeater fixture in transmission (e.g., where the functional change relates a compromised communication data stream resulting in a miss-transmission of information between a slave device and a master device), an internal reset signal not being deglitched (where the functional change is an occurrence of a reset).

The inspection unit PC may comprise a display unit DISP arranged to present the one or more monitor register values and the one or more monitor waveforms to a user. This may allow the user to determine a functional change resulting from the electrostatic discharge from the one or more monitor waveforms and the one or more monitor register values as function of time and to identify a root cause of the functional change. The inspection unit may further comprise a memory and/or a processor for storing and/or processing the one or more register values and the one or more monitor waveforms. The monitor waveforms may be processed to be presented in a processed form, e.g., filtered, averaged, segmented, assigning high-lights to portions, etc.

The inspection unit may comprise an expert component arranged to determine a functional change resulting from the electrostatic discharge from the one or more monitor waveforms and the one or more monitor register values as function of time.

The inspection unit may comprise a conclusion unit arranged to identify a root cause of the functional change from the functional change and the one or more monitor waveforms and/or the one or more monitor register values as function of time. The conclusion unit may e.g. be arranged to retrieve the root cause from a predefined table associating correlations between functional changes, one or more monitor waveforms and one or more register values with root causes.

Figure 2:
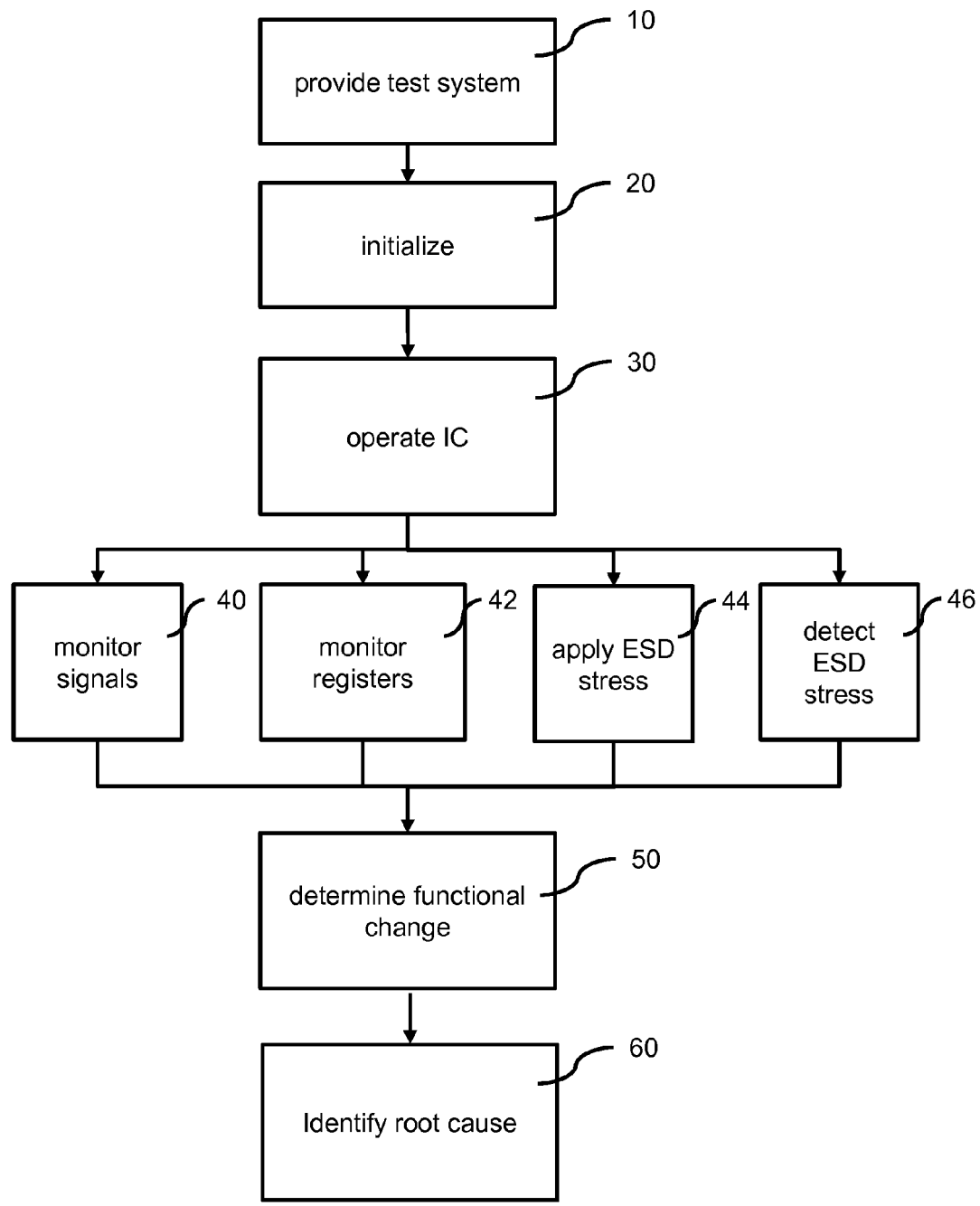
FIG. 2 schematically shows an example of an embodiment of a method of testing a semiconductor device against electrostatic discharge.

FIG. 2 schematically shows an example of an embodiment of a method of testing a semiconductor device against electrostatic discharge.

The method may comprise providing 10 a system for of testing a semiconductor device against electrostatic discharge, for example the system 1 as described with reference to FIG. 1. The method may next comprise initializing the system and initializing the semiconductor device 1 to a predefined state. Initializing the semiconductor device 1 may e.g. comprise setting the internal registers of the semiconductor device to appropriate values. Initializing the system may e.g. comprise setting analogue supply signals to appropriate levels (e.g., as provided by side circuitry SIDEQ described above) and conditioning data signals and other signals with appropriate levels. Initializing the system may comprise initializing the control unit MCU with appropriate values. Initializing may comprise setting any interfaces to appropriate interface conditions, such as an interface protocol and an interface speed.

The method comprises operating 30 the semiconductor device, and, while operating the semiconductor device, monitoring a functional performance of the semiconductor device. The monitoring comprises monitoring 40 one or more signal waveforms of respective one or more signals on respective one or more pins of the semiconductor device to obtain one or more monitor waveforms. At least one of the one or more signals on the pins may be associated with at least one of supply voltages, communication signals and control signals. The monitoring comprises monitoring 42 one or more register values of one or more registers of the semiconductor device to obtain one or more monitor register values as function of time. At least one of the one or more registers may be associated with at least one of status registers and control registers.

The method comprises applying 44 an electrostatic discharge event to the semiconductor device while monitoring the functional performance of the semiconductor device. The electrostatic discharge event may be an event as defined in any of the standards cited in the introduction or in another standard. The electrostatic discharge event may comprise one ESD pulse, or a plurality of sequential ESD pulses.

The method may thus monitor the internal performance of the semiconductor device from collecting signal waveforms and register values before, during and/or after the ESD event. The method may allow to not just detect whether a semiconductor device is immune to one or more ESD events, but also to analyse the effect of one or more ESD events on the functional performance of the semiconductor device during and/or after the ESD events. The method may allow to determine which specific functional change occurs as a result of an external ESD event. The method may further allow to determine a root cause of the functional change. Knowing the root cause may allow a designer to improve the design of the semiconductor device. Knowing the root cause may allow a designer to provide recommendations on externally connected circuitry, such as for example decouple capacitors, pull-down resistors and alike, or—e.g. for class D devices—recommendations as to which type of reset actions could be implemented with external circuitry to allow the use of the semiconductor device.

The method may further comprise detecting 46 the electrostatic discharge event and measuring an ESD waveform. The measured ESD waveform may serve to trigger the monitoring of signal waveforms and/or monitoring of register values, and/or may be used to find relevant time periods over the total duration of monitoring the signal waveforms and/or register values.

The method may further comprise determining 50 a functional change from the one or more monitor waveforms and the one or more monitor register values as function of time.

The method may further comprise identifying 60 a root cause of the functional change from the functional change and the one or more monitor waveforms and/or the one or more monitor register values as function of time.

Determining the functional change may comprise correlating one or more monitor waveforms and one or more monitor register values obtained prior to the application of the electrostatic discharge with one or more monitor waveforms and one or more monitor register values obtained during and/or after the application of the electrostatic discharge. Hereby, a change in monitor waveform and/or a change in register value may be detected. Further, specific correlations between one or more monitor waveforms with register values may be associated with specific functional changes.

In embodiments where the method comprises detecting 46 the electrostatic discharge event and measuring the ESD waveform, determining 50 the functional change may further comprise correlating with the ESD waveform. Thus, a correlation of e.g. the obtained signal waveforms with the ESD waveform may facilitate the determining of the functional change. The ESD waveform may, for example, be used as a trigger signal to synchronize measurements of other waveforms.

Determining the functional change and/or identifying its root cause may be performed automatically, such as by a computer. Determining the functional change and/or identifying its root cause may alternatively be performed by a user.

The method may further comprise presenting the one or more monitor waveforms and the one or more register values as function of time to a user. This may allow the user to determine the functional change and/or to identify the root cause of the functional change.

Monitoring the one or more register values may be performed via an opto-coupled interface. The method may further comprise controlling the semiconductor device via the opto-coupled interface, e.g., by writing new values in control registers of the semiconductor device. The method may comprise supplying the opto-coupled interface with a supply voltage using a test-side convertor supply BATOT, wherein the test-side convertor supply BATOT is galvanically isolated from the semiconductor device.

Monitoring the one or more signal waveforms may comprises using an oscilloscope OSC to measure the one or more signal waveforms.

Figure 3:
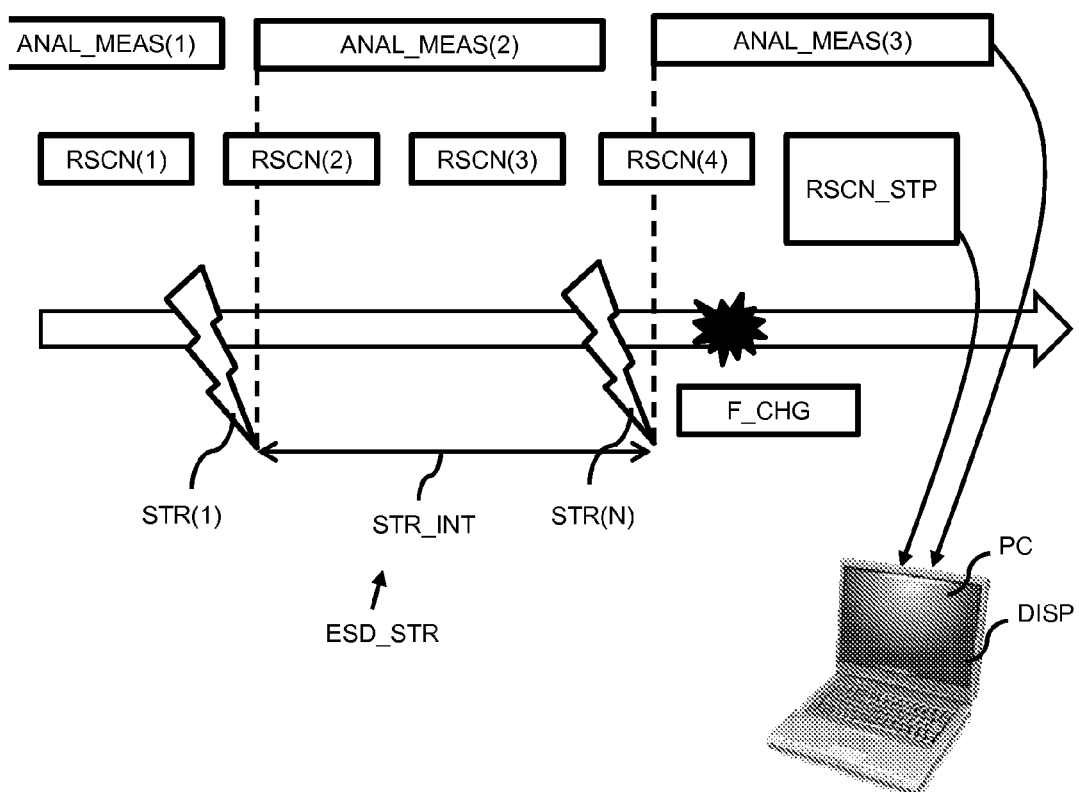
FIG. 3 schematically illustrates an example of a method of testing.

FIG. 3 schematically illustrates an example of a method of testing as described with reference to FIG. 2. Below, only some specific aspects of the exemplary method will be described—reference is made to the general description in FIG. 1 and FIG. 2 for further aspects.

FIG. 3 shows that monitoring 40 one or more signal waveforms of respective one or more signals on respective one or more pins of the semiconductor device to obtain one or more monitor waveforms may comprise performing a sequence of measurements ANAL_MEAS(1), ANAL_MEAS(2), ANAL_MEAS(3) of the signal waveforms and providing the sequence of measurements to an inspection unit, here shown as a laptop PC with a display unit DISP. Each measurement of the sequence of measurement may be associated with receiving one or more signal waveforms with a high-bandwidth digital oscilloscope until its internal memory is full, and then sending the obtained monitor waveform of the measurement to the inspection unit. At least one of the one or more signals on the pins may be associated with at least one of supply voltages, communication signals and control signals.

FIG. 3 shows that monitoring 42 one or more register values of one or more registers of the semiconductor device to obtain one or more monitor register values as function of time may comprise performing a sequence of register scans RSCN(1), RSCN(2), RSCH(3), RSCN(4). The sequence of register scans may be terminated with a last register scan RSCN_STP. The register values obtained from each register scan are also provided to the inspection unit. The sequence may for example be terminated one a functional change is detected, at a predetermined time period after the electrostatic discharge event ESD_STR, or after a stable functional performance is reached. At least one of the one or more registers may be associated with at least one of status registers and control registers.

FIG. 3 shows that an electrostatic discharge event ESD_STR comprising a plurality of ESD pulses STR(1), STR(N=2) at intervals STR_INT is applied while monitoring 40 one or more signal waveforms and monitoring 42 one or more register values.

FIG. 3 also shows that at some moment, here indicated with the star*, a functional change F_CHG occurs.

Figure 4:
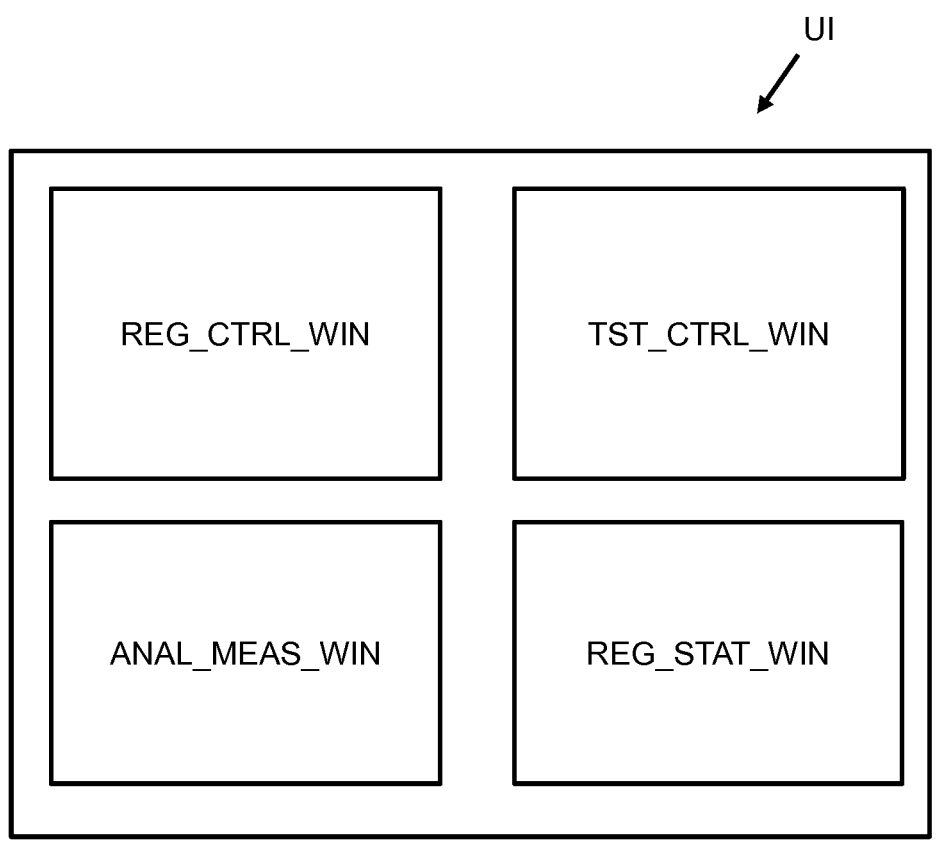
FIG. 4 schematically shows an example of user interface.

FIG. 4 shows an exemplary user interface UI that may be used to control an exemplary method of testing. The UI comprises a plurality of windows. A first window REG_C-TRL_WIN represents a first user interface allowing a user to control the semiconductor device, such as to initialize its registers with appropriate values for each of one or more test scenarios. A second window TST_CTRL_WIN represents a second user interface allowing a user to control the other components of the system, such as to initialize registers of the control unit MCU or the side equipment SIDEQ with appropriate values for each of one or more test scenarios, and to control the measurement unit via the GPIB interface. A third window ANAL_MEAS_WIN is presented to display the obtained monitor waveforms—an example is given in FIG. 5. A fourth window REG_STAT_WIN is presented to display the one or more monitor register values.

Figure 5:
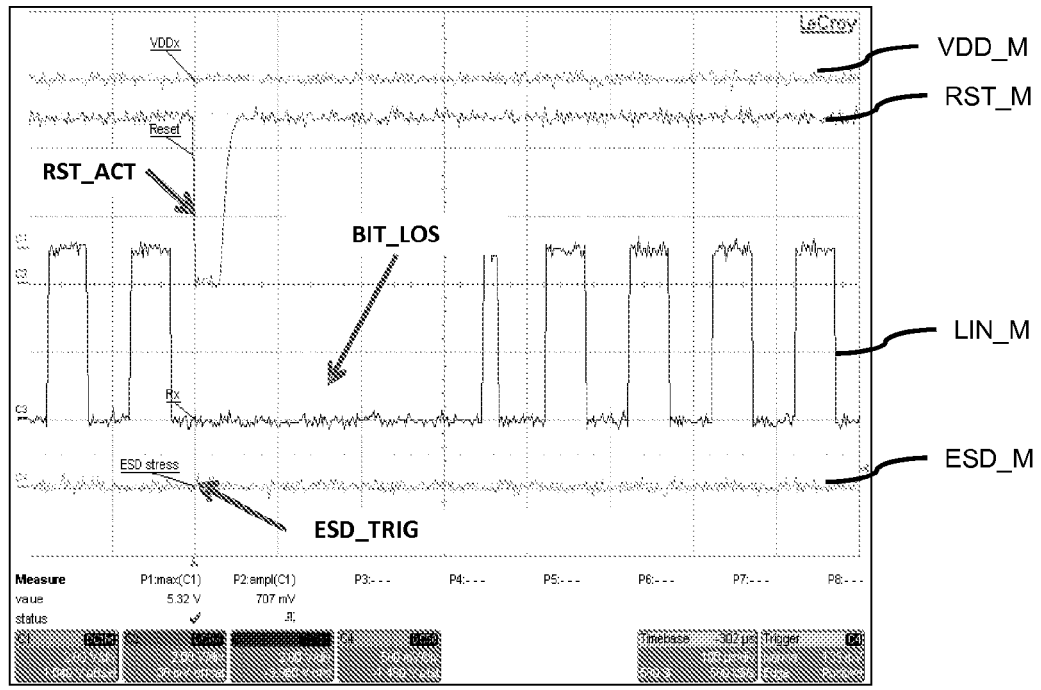
FIG. 5 schematically shows an example of obtained monitor signals.
Figure 6:
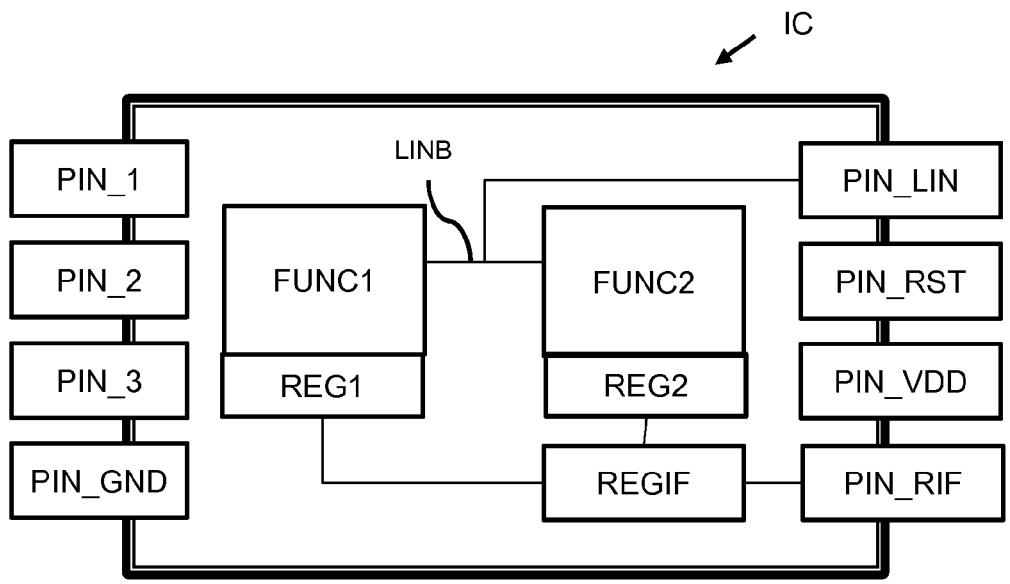
FIG. 6 schematically illustrates a semiconductor device associated with the example FIG. 5.

FIG. 5 schematically shows an example of obtained monitor waveforms as well as an ESD waveform, as obtained during a certain time duration using a measurement unit in the form of a digital oscilloscope OSC, when testing a semiconductor device shown in FIG. 6. FIG. 5 shows the obtained monitor waveforms as well as the ESD waveform before, during and after the ESD stress.

FIG. 6 schematically illustrates a semiconductor device IC associated with the example FIG. 5. The semiconductor device IC comprises a plurality of pins PIN_1, PIN_2, PIN_3, PIN_GND, PIN_LIN, PIN_RST, PIN_VDD, PIN_RIF, a plurality of functional units (of which two are shown as FUNC1, FUNC2), and an internal register interface REGIF. The functional units FUNC1, FUNC2 are associated with one or more registers, indicated as REG1, REG2. The internal register interface REGIF provides an interface to registers REG1, REG2 via pin PIN_RIF. REG1 corresponds to an internal RESET status register. REG2 corresponds to a LIN-bus status register. The functional units FUNC1, FUNC2 are connected via a Local Interconnect Network (LIN)-bus on the semiconductor device IC. The LIN-bus is also connected to PIN_LIN to allow it being monitored. An internal reset line (not shown) is also connected to PIN_RST to allow it being monitored. Pin PIN_VDD is provided to carry supply voltage VDD. Pin PIN_GND is provided to connect to ground. Not all internal connections are shown. The semiconductor device 10 may further have more pins than the ones shown.

FIG. 5 shows a first monitor waveform VDD_M associated with supply voltage VDD on pin PIN_VDD of the semiconductor device. The first monitor waveform VDD_M as shown indicates that the supply voltage was substantially stable during the shown duration.

A second monitor waveform RST_M is associated with an internal control signal, here the reset signal, that is also provided on external pin PIN_RST to allow it being monitored. The second monitor waveform RST_M shows that the reset signal changed from its high value corresponding to RESET_INACTIVE to a low value RESET ACTIVE during a short period of time.

A third monitor waveform LIN_M is associated with a communication signal, here a signal of the LIN-bus. The signal is also provided on external pin PIN_LIN to allow it being monitored. The third monitor waveform LIN_M shows that bits (clock pulses) were lost during a period BIT LOS.

The ESD waveform ESD_M indicates a very narrow peak ESD_TRIG associated with the ESD stress.

Besides the monitor waveforms, the register values of registers REG1 and REG2 are also monitored, to obtain monitor register values of the internal RESET register and the LIN-bus status register as function of time.

The monitor waveforms shown in FIG. 5 and the monitor register values may be obtained before the ESD stress to obtain associated reference measurements. The ESD stress may e.g. comprise 5 ESD pulses, each pulse having a length between 200 ns and 1 μs. The monitor waveforms and the monitor register values may further be obtained during and after the ESD stress.

From correlating the monitor register values REG1, REG2 with the second and the third monitor waveforms RST_M, LIN_M, it may be determined from that a functional change occurred as a result of the ESD stress, and that the functional change corresponds to a reset and a LIN-bus partial loss. From the second monitor waveform RST)M and the functional change, the root cause may be identified to be a lack of deglitching of the internal reset signal in the semiconductor device.

Another example of a functional change could be that a product goes from a normal mode then going into failsafe mode. Its root cause could be an over- or under-voltage on regulators which generates an internal error.

Figure 7:
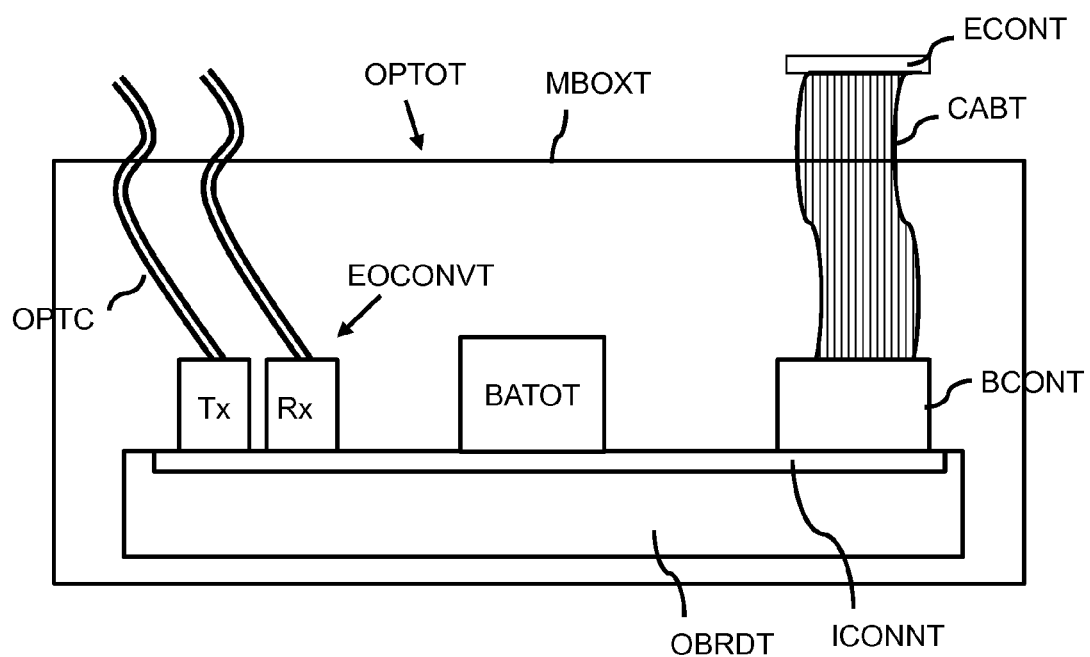
FIG. 7 schematically shows a test-side opto-coupled board.
Figure 8:
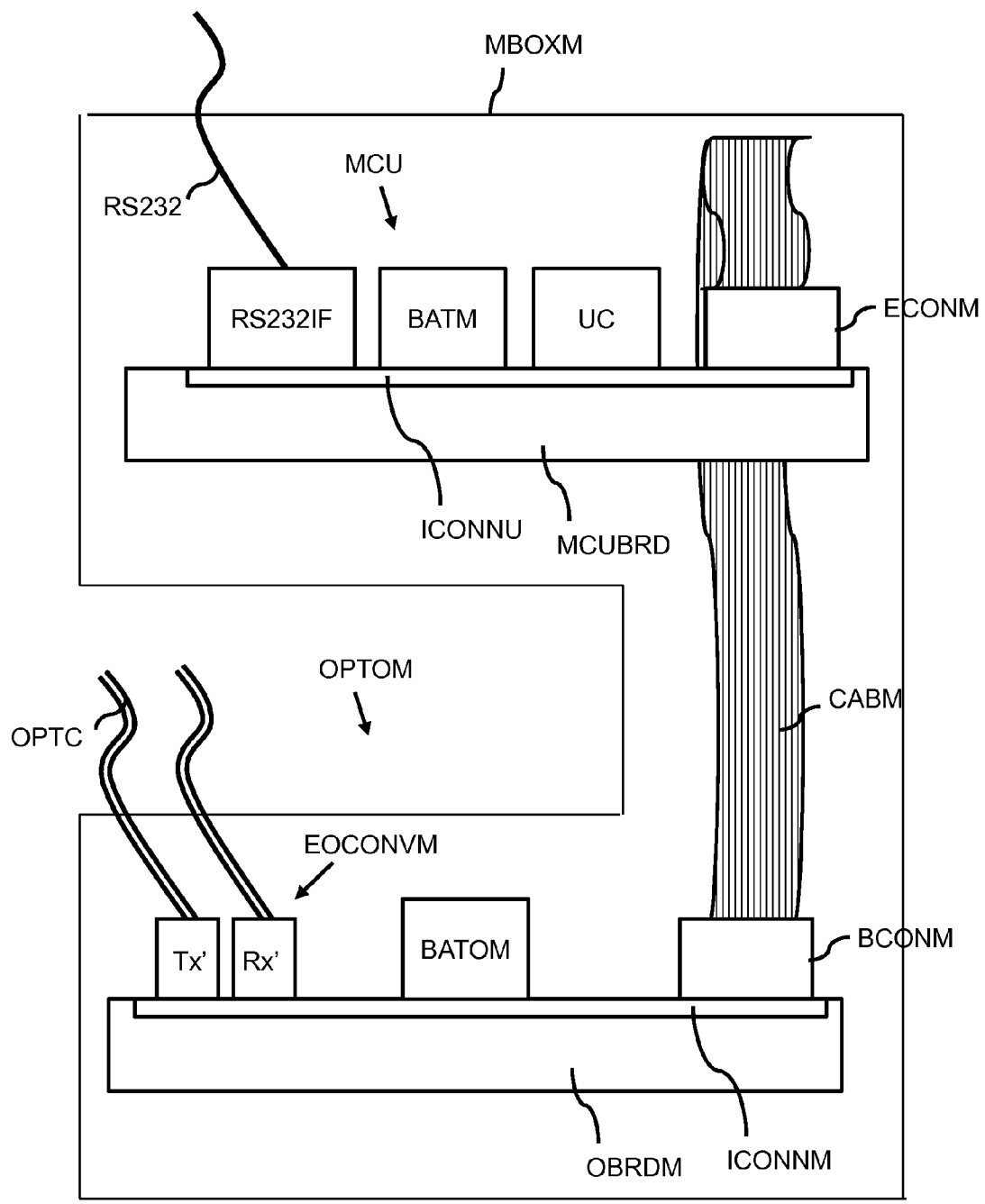
FIG. 8 schematically shows a safe-side opto-coupled board connected to a control unit.

FIG. 7 and FIG. 8 schematically show features associated with the opto-coupled interface OPTIF. FIG. 7 schematically shows a test-side opto-coupled board OPTOT.

FIG. 7 schematically shows a test-side interface board OPTOT. The test-side interface board OPTOT comprises a test-side electro-optical convertor EOCONVT connected to the register interface and a test-side convertor supply BATOT for supplying the test-side electro-optical convertor EOCONVT with a supply voltage. The test-side convertor supply BATOT is galvanically isolated from the test board TSTBRD. The test-side electro-optical convertor EOCONVT comprises a receiver with a receiver connector Rx and a transmitter with a transmitter connector Tx. The receiver is arranged to receive optical signals from the optical connection OPTC and to convert the optical signals as received into electrical signals. These electrical signals are provided to the first flat-cable CABT via an interconnect structure ICONNT provided on board OBRDT and interface-board connector BCONT. The transmitter is arranged to receive electrical signals from the first flat-cable CABT via the interconnect structure ICONNT and to convert the electrical signals as received into optical signals. These optical signals are provided to the optical connection OPTC via transmitter connector Tx.

The test-side electro-optical convertor EOCONVT and the test-side convertor supply BATOT are arranged inside a test-side metallic box MBOXT. The test-side metallic box MBOXT forms a Faraday cage around the test-side electro-optical convertor EOCONVT and the test-side convertor supply BATOT. This protects the test-side electro-optical convertor EOCONVT and the test-side convertor supply BATOT from radiated emission during the applied ESD stress. The test-side metallic box MBOXT further encloses the connectors Tx, Rx of the transmitter and receiver and interface-board connector BCONT. The test board TSTBRD and semiconductor device IC are outside the test-side metallic box MBOXT.

FIG. 8 schematically shows a safe-side opto-coupled board OPTOM connected to a control unit MCU. The safe-side interface board OPTOM comprises a safe-side electro-optical convertor EOCONVM connected to the control unit MCU and a safe-side convertor supply BATOM for supplying the safe-side electro-optical convertor EOCONVM with a supply voltage. The safe-side electro-optical convertor EOCONVM comprises another receiver with receiver connector Rx' and another transmitter with transmitter connector Tx'. The other receiver is arranged to receive optical signals from the optical connection OPTC and to convert the optical signals as received into electrical signals. These electrical signals are provided to the second flat-cable CABM via interconnect structure ICONNM provided on board OBRDM and interface-board connector BCONM. The transmitter is arranged to receive electrical signals from the second flat-cable CABM via the interconnect structure ICONNM and to convert the electrical signals as received into optical signals. These optical signals are provided to the optical connection OPTC via transmitter connector Tx'.

The safe-side electro-optical convertor EOCONVM, the safe-side convertor supply BATOM and the control unit MCU may be arranged inside a safe-side metallic box MBOXM. The safe-side metallic box may thus form an associated Faraday cage around the safe-side electro-optical convertor EOCONVM, the safe-side convertor supply BATOM and the control unit MCU. This may protect the safe-side electro-optical convertor EOCONVM, the safe-side convertor supply BATOM and the control unit MCU from radiated emission during the applied ESD stress. The safe-side metallic box further encloses the associated connectors Tx', Rx' of the transmitter and receiver and safe-side interface-board connector BCONM.

FIG. 8 schematically shows that the control unit MCU comprises a microcontroller UC on a control board MCU-BRD and an RS232 interface device RS2321F for interfacing via a serial RS232 interface RS232 to a host. The microcontroller UC is connected via interconnect structure ICONNU to the RS232 interface. The microcontroller UC is further connected via interconnect structure ICONNU and connector ECONM to the second flat-cable CABM.

The system may further comprise a control supply BATM (see also FIG. 1) for supplying the control unit MCU with a control supply voltage. The control supply BATM may be arranged on the control board MCUBRD, as is shown in FIG. 8, and connected via interconnect structure ICONNU to the microcontroller UC. The control supply BATM may also be arranged inside the safe-side metallic box MBOXM. This may protect the control supply BATM from radiated emission during the applied ESD stress, and thereby provide a stable control supply voltage to the control unit MCU.

With the system and method of the invention, it is possible to not just detect whether a semiconductor device is immune to one or more external stresses, but also to analyse the effect of one or more ESD stresses on the functional performance of the semiconductor device. It is possible to determine which specific functional change occurs as a result of an external stress. It may further be possible to determine a root cause of the functional change. When knowing its cause, the design of the semiconductor device and/or the design of any arrangements of external components connecting to the semiconductor device during its application, may be adapted to improve its robustness against external stresses that have been specifically identified to cause a specific functional change.

Figure 9:
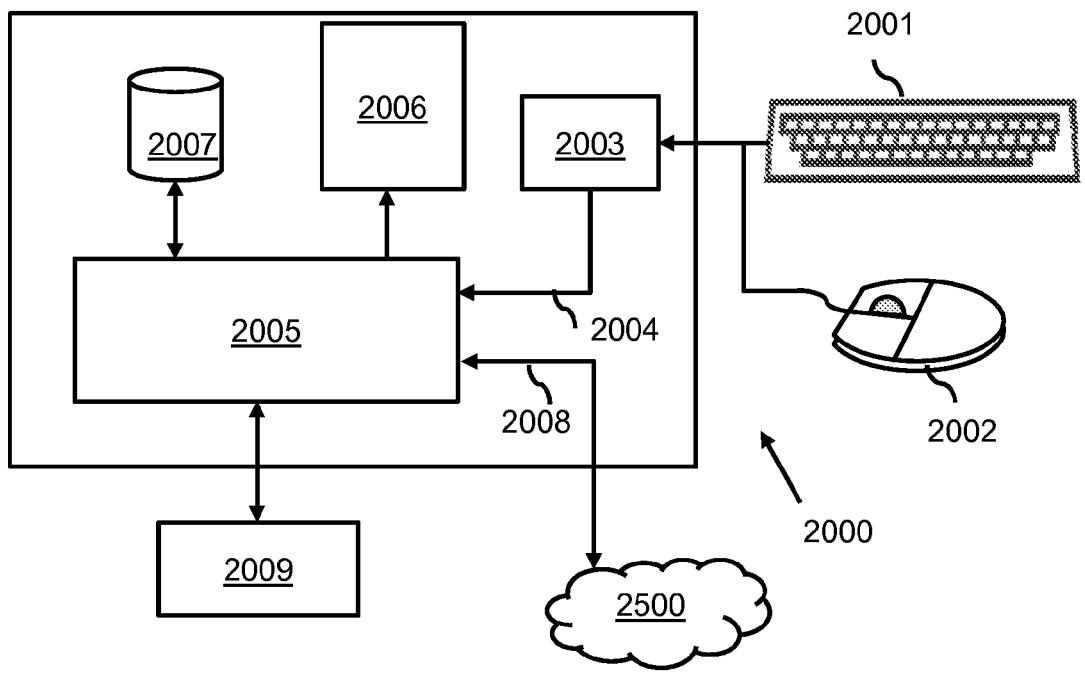
FIG. 9 schematically shows an exemplary user interaction system.

FIG. 9 schematically shows an exemplary user interaction system 2000 having a programmable processor 2005. The user interaction system 2000 is shown to be a personal computer, but may be any type of suitable user interaction system 2000. The programmable processor may comprise one or more components of system 1. The user interaction system 2000 further comprises a storage unit 2007, a user input 2003 and a display 2006, which may be the same as display DISP in FIG. 1 or an additional display. The user input 2003 allows the user to input user data and user instructions 2004 to the processor 2005 by e.g. using a keyboard 2001 or a mouse 2002. Also, although not shown, the display 2006 may comprise a touch-sensitive surface for enabling the user to provide user data and user instructions to the user input 2003 by means of touching the display 2006. The processor 2005 is arranged to perform any one of the methods according to the invention, to receive user data and user instructions 2004, to present visual information on the display 2006 and to communicate with a data I/O device 2009, such as an optical disc drive or a solid state reader/writer. The processor 2005 is arranged to cooperate with the storage unit 2007, allowing storing and retrieving information on the storage unit 2007, such as the one or more monitor waveforms and the one or more monitor register values as function of time. The user interaction system 2000 may further comprise a communication channel 2008 allowing the processor 2005 to connect to an external cloud 2500 for communicating with other devices in the cloud. The external cloud may e.g. be the Internet. The user interaction system 2000 may allow controlling the system 1 by a user (also refer to FIG. 4). The processor 2005 may also be arranged to retrieve the one or more monitor waveforms and the one or more monitor register values as function of time determined during further executions of the method from the storage unit 2007, or from another device in the cloud 2500, and generate a report by the processor 2005. The processor 2005 may be capable to read, using the data I/O device 2009, a computer readable medium comprising a program code. The processor 2005 may be capable to read, using the data I/O device 2007, a computer readable medium comprising a computer program product comprising instructions for causing the user interaction system 2000 to perform a method as described with reference to FIG. 2.

Figure 10:
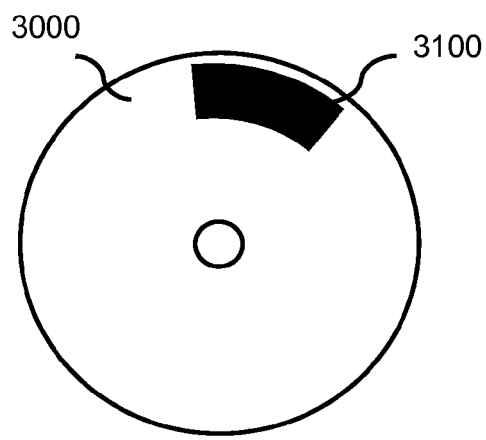
FIG. 10 shows a computer readable medium comprising a computer program product.

FIG. 10 shows a computer readable medium 3000 comprising a computer program product 3100, the computer program product 3100 comprising instructions for causing a processor apparatus to perform a method as described above, or at least part of the method. The computer program product 3100 may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 8 as an optical disc, the computer readable medium 3000 may be any suitable computer readable medium, such as a hard disk, solid state memory, flash memory, etc., and may be non-recordable or recordable.

The invention may thus also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

As used herein, the term "bus" is used to refer to a plurality of signals or conductors which may be used to transfer one The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/ dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system PC is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. For example, the control board MCUBRD and board OBRDM may be parts of a single board, and/or the control unit MCU may comprise the safe-side electro-optical convertor EOCONVM.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of testing a semiconductor device against electrostatic discharge, the method comprising:
   operating the semiconductor device;
   while operating the semiconductor device, monitoring a functional performance of the semiconductor device, the monitoring comprising:
      monitoring one or more signal waveforms of respective one or more signals on respective one or more pins of the semiconductor device to obtain one or more monitor waveforms while applying an electrostatic discharge event to the semiconductor device, and
      monitoring, via an opto-coupled interface, one or more register values of one or more registers of the semiconductor device to obtain one or more monitor register values as function of time while applying the electrostatic discharge event to the semiconductor device, wherein the opto-coupled interface comprises a test-side electro-optical convertor and a test-side convertor supply for supplying the test-side electro-optical convertor with a supply voltage, the test-side convertor supply being galvanically isolated from the test board.

2. The method according to claim 1, further comprising: determining a functional change from the one or more monitor waveforms and the one or more monitor register values as function of time.

3. The method according to claim 2, further comprising: identifying a root cause of the functional change from the functional change and the one or more monitor waveforms and/or the one or more monitor register values as function of time.

4. The method according to claim 2, wherein determining the functional change comprises:
   correlating one or more monitor waveforms and one or more monitor register values obtained prior to the application of the electrostatic discharge with one or more monitor waveforms and one or more monitor register values obtained during and/or after the application of the electrostatic discharge.

5. The method according to claim 1, further comprising detecting the electrostatic discharge event and measuring an ESD waveform.

6. The method according to claim 5, wherein determining the functional change further comprises correlating with the ESD waveform.

7. The method according to claim 1, further comprising presenting the one or more monitor waveforms and the one or more register values as function of time to a user.

8. The method according to claim 1, wherein monitoring the one or more signal waveforms comprises using an oscilloscope to measure the one or more signal waveforms.

9. The method according to claim 1, further comprising controlling the semiconductor device via an opto-coupled interface.

10. The method according to claim 1, at least one of the one or more registers being associated with at least one of status registers and control registers, and at least one of the one or more signals on the pins being associated with at least one of supply voltages, communication signals and control signals.

11. The method according to claim 1, the electrostatic discharge event comprising a plurality of ESD pulses.

12. A system for testing a semiconductor device against electrostatic discharge, the system comprising:
   a test board for carrying the semiconductor device during testing of the semiconductor device, the test board comprising a register interface for accessing one or more registers of the semiconductor device and one or more test points for measuring signals on pins of the semiconductor device;
   an opto-coupled interface connected to the register interface;
   an ESD generator arranged to apply an electrostatic discharge event to the semiconductor device;
   a control unit for controlling the semiconductor device, the control unit being connected via the opto-coupled interface to the test board and arranged to monitor one or more register values of one or more registers of the semiconductor device to obtain one or more monitor register values as function of time while the electrostatic discharge event to the semiconductor device;

the opto-coupled interface comprising:
- a test-side electro-optical convertor connected to the register interface;
- a safe-side electro-optical convertor connected to the control unit:
- an optical connection between the test-side electro-optical convertor and the safe-side electro-optical convertor; and
- a test-side convertor supply for supplying the test-side electro-opticalconvertor with a supply voltage, the test-side convertor supply being galvanically isolated from the test board;
- a waveform measurement unit connected to the test board and arranged to monitor one or more signal waveforms of respective one or more signals on respective one or more pins of the semiconductor device to obtain one or more monitor waveforms while the electrostatic discharge event to the semiconductor device; and
- an inspection unit connected to the control unit for receiving the one or more monitor register values and connected to the waveform measurement unit for receiving the one or more monitor waveforms.

13. The system according to claim 12, the inspection unit comprising a display unit to present the one or more monitor register values and the one or more monitor waveforms to a user.

14. The system according to claim 12, the inspection unit comprising an expert component arranged to determine a functional change resulting from the electrostatic discharge from the one or more monitor waveforms and the one or more monitor register values as function of time.

15. The system according to claim 14, the inspection unit comprising a conclusion unit arranged to identify a root cause of the functional change from the functional change and the one or more monitor waveforms and/or the one or more monitor register values as function of time.

16. The system according to claim 12, the test-side electro-optical convertor and the test-side convertor supply being arranged inside a test-side metallic box forming a Faraday cage around the test-side electro-optical convertor and the test-side convertor supply.

17. The system according to claim 12, further comprising a safe-side convertor supply for supplying the safe-side electro-optical convertor with an associated supply voltage and a control supply for supplying the control unit with a control supply voltage, wherein the safe-side electro-optical convertor, the safe-side convertor supply, the control supply and the control unit are arranged inside a safe-side metallic box forming an associated Faraday cage around the safe-side electro-optical convertor, the safe-side convertor supply, the control supply and the control unit.

* * * * *